US009582224B2

(12) United States Patent
Lin et al.

(10) Patent No.: US 9,582,224 B2
(45) Date of Patent: Feb. 28, 2017

(54) MEMORY CONTROL CIRCUIT UNIT, MEMORY STORAGE APPARATUS AND DATA ACCESSING METHOD

(71) Applicant: PHISON ELECTRONICS CORP., Miaoli (TW)

(72) Inventors: Wei Lin, Taipei (TW); Kuo-Hsin Lai, Hsinchu County (TW); Tien-Ching Wang, Kaohsiung (TW)

(73) Assignee: PHISON ELECTRONICS CORP., Miaoli (TW)

( * ) Notice: Subject to any disclaimer, the term of this patent is extended or adjusted under 35 U.S.C. 154(b) by 71 days.

(21) Appl. No.: 14/702,768

(22) Filed: May 4, 2015

(65) Prior Publication Data

US 2016/0266791 A1   Sep. 15, 2016

(30) Foreign Application Priority Data

Mar. 9, 2015 (TW) .............................. 104107464 A

(51) Int. Cl.
*G06F 12/00* (2006.01)
*G06F 3/06* (2006.01)
*G11C 16/34* (2006.01)

(52) U.S. Cl.
CPC ............ *G06F 3/0688* (2013.01); *G06F 3/064* (2013.01); *G06F 3/0619* (2013.01); *G06F 3/0679* (2013.01); *G11C 16/34* (2013.01)

(58) Field of Classification Search
CPC .............................. G06F 3/061; G06F 3/0655
See application file for complete search history.

(56) References Cited

U.S. PATENT DOCUMENTS

| | | | |
|---|---|---|---|
| 2009/0259803 A1* | 10/2009 | Oh | ...................... G11C 11/5628 711/103 |
| 2012/0215963 A1 | 8/2012 | Kim et al. | |
| 2013/0016562 A1 | 1/2013 | Mun | |

FOREIGN PATENT DOCUMENTS

TW   1442221   6/2014

OTHER PUBLICATIONS

"Office Action of Taiwan Counterpart Application", issued on Jun. 21, 2016, p. 1-p. 10.

* cited by examiner

*Primary Examiner* — Larry Mackall
(74) *Attorney, Agent, or Firm* — Jianq Chyun IP Office

(57) ABSTRACT

A memory control circuit unit including a plurality of data randomizer circuits and a data selection circuit is provided. When a first data stream is received from a host system, the first data stream is input into the data randomizer circuits to respectively output a plurality of second data streams. The data selection circuit selects one of the second data streams as a third data stream according to contents of the second data streams, and the third data stream is programmed into a rewritable non-volatile memory module. Accordingly, data written into the rewritable non-volatile memory module can be effectively disarranged.

27 Claims, 9 Drawing Sheets

MEMORY CONTROL CIRCUIT UNIT, MEMORY STORAGE APPARATUS AND DATA ACCESSING METHOD

CROSS-REFERENCE TO RELATED APPLICATION

This application claims the priority benefit of Taiwan application serial no. 104107464, filed on Mar. 9, 2015. The entirety of the above-mentioned patent application is hereby incorporated by reference herein and made a part of this specification.

BACKGROUND

Technical Field

The present invention relates to a memory control circuit unit for controlling a rewritable non-volatile memory module, a memory storage apparatus using the memory control circuit unit, and a data accessing method thereof.

Description of Related Art

The growth of digital cameras, mobile phones, and MP3 players has been expanded rapidly in recent years. Consequently, the consumers' demand for storage media has increased tremendously. A rewritable non-volatile memory is one of the most adaptable memories for portable electronic products such as notebook computers due to its data non-volatility, low power consumption, small volume, non-mechanical structure and high read/write speed. A solid state drive is a storage apparatus which utilizes a flash memory as its storage medium. For these reasons, the flash memory has become an import part of the electronic industries.

With advancements in the semiconductor fabrication, a flash memory module having a memory cell capable of storing a plurality data bits has been developed in the current technology. Specifically, a data writing (or known as programming) of the flash memory module changes on-state of a channel of the memory cell in order to present different storage states by applying a voltage to a specific terminal of a flash memory device (e.g., amount of electrons in an charge-trapping layer of a gate may be changed by controlling a gate voltage). Take a Multi-Level Cell (MLC) NAND type flash memory for example, when a lower page data is 1 and an upper page data is 1, a control circuit may control a word line control circuit not to change the gate voltage in the memory cell but maintain the storage state of the memory cell at "11"; when the lower page data is 1 and the upper page data is 0, the word line control circuit changes the gate voltage in the memory cell under control of the control circuit, so as to change the storage state of the memory cell to be "10"; when the lower page data is 0 and the upper page data is 0, the word line control circuit changes the gate voltage in the memory cell under control of the control circuit, so as to change the storage state of the memory cell to be "00," and, when the lower page data is 0 and the upper page data is 1, the word line control circuit changes the gate voltage in the memory cell under control of the control circuit, so as to change the storage state of the memory cell to be "01." In other words, when data is read, the control circuit identifies the storage state of a current memory cell according to the gate voltage in the current memory cell.

However, in such architecture where one memory cell is capable of storing multiple bits, if data stored on the memory cells of the same word line is not disarranged properly, errors may occur on the data identification due to factors such as uneven arrangement, shifts in reading voltage or uneven resistance on bit lines. Accordingly, it is one of the major subjects in the industry as how to effectively disarrange the written data when executing a programming operation on the rewritable non-volatile memory module.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

According to exemplary embodiments of the present invention, a memory control circuit unit is provided, which includes a host interface, a memory interface, data randomizer circuits, a data selection circuit and a memory management circuit. The host interface is configured to couple to a host system. The memory interface is configured to couple to a rewritable non-volatile memory module, wherein the rewritable non-volatile memory module has a plurality of physical programming units. Each of the data randomizer circuits disarranges input data to output a corresponding disarranged data and each of the data randomizer circuits has an index number corresponding thereto. The memory management circuit is coupled to the host interface, the memory interface, the data randomizer circuits and the data selection circuit. The memory management circuit receives a first data stream from the host system, and input the first data stream into the data randomizer circuits. The data randomizer circuits disarrange the first data stream to respectively output a plurality of second data streams. The data selection circuit selects one of the second data streams as a third data stream according to contents of the second data streams. The memory management circuit issues a command for the rewritable non-volatile memory module to write the third data stream into a first physical programming unit among the physical programming units.

According to an exemplary embodiment of the present invention, a memory storage apparatus is provided, which includes a connection interface unit, a rewritable non-volatile memory module and a memory control circuit unit, is provided. The connection interface unit is configured to couple to a host system. The rewritable non-volatile memory module includes a plurality of physical programming units. The memory control circuit unit is coupled to the connection interface unit and the rewritable non-volatile memory module, and includes aforesaid data randomizer circuits, aforesaid data selection circuit and aforesaid memory management circuit.

According to an exemplary embodiment of the present invention, a data accessing method for a rewritable non-volatile memory module is provided. The method includes: receiving a first data stream from the host system; and inputting the first data stream into a plurality of data randomizer circuits to generate a plurality of second data streams, wherein each of the data randomizer circuits disarranges input data to output a corresponding disarranged data and each of the data randomizer circuits has an index number. The method further includes: selecting one of the second data streams as a third data streams according to contents of the second data streams; and writing the third data stream into a first physical programming unit among the physical programming units.

Based on the above, the memory control circuit unit, the memory storage apparatus and the data accessing method thereof as proposed in the exemplary embodiments of the invention are capable of effectively disarranging the data to prevent errors from occurring on the data identification due to factors, such as uneven arrangement, shifts in reading voltage or uneven resistance on bit lines.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
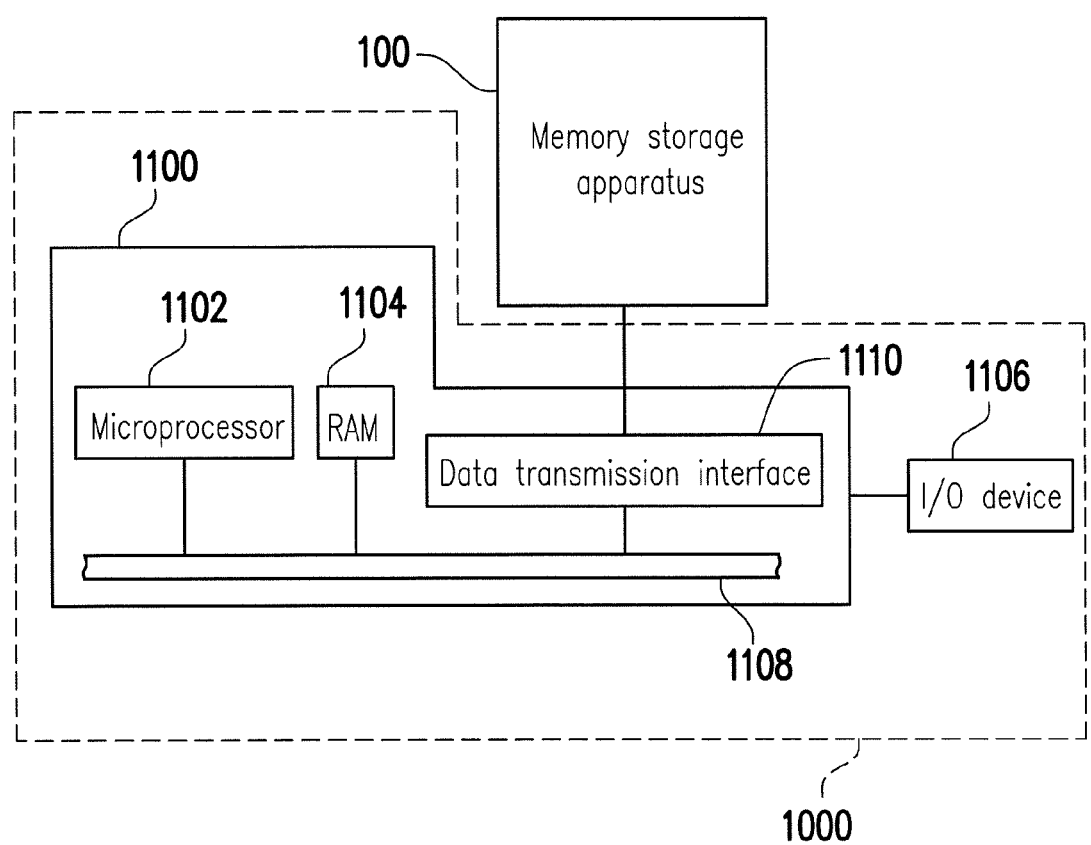
FIG. 1 illustrates a host system and a memory storage apparatus according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1 illustrates a host system and a memory storage apparatus according to an exemplary embodiment.

Figure 2:
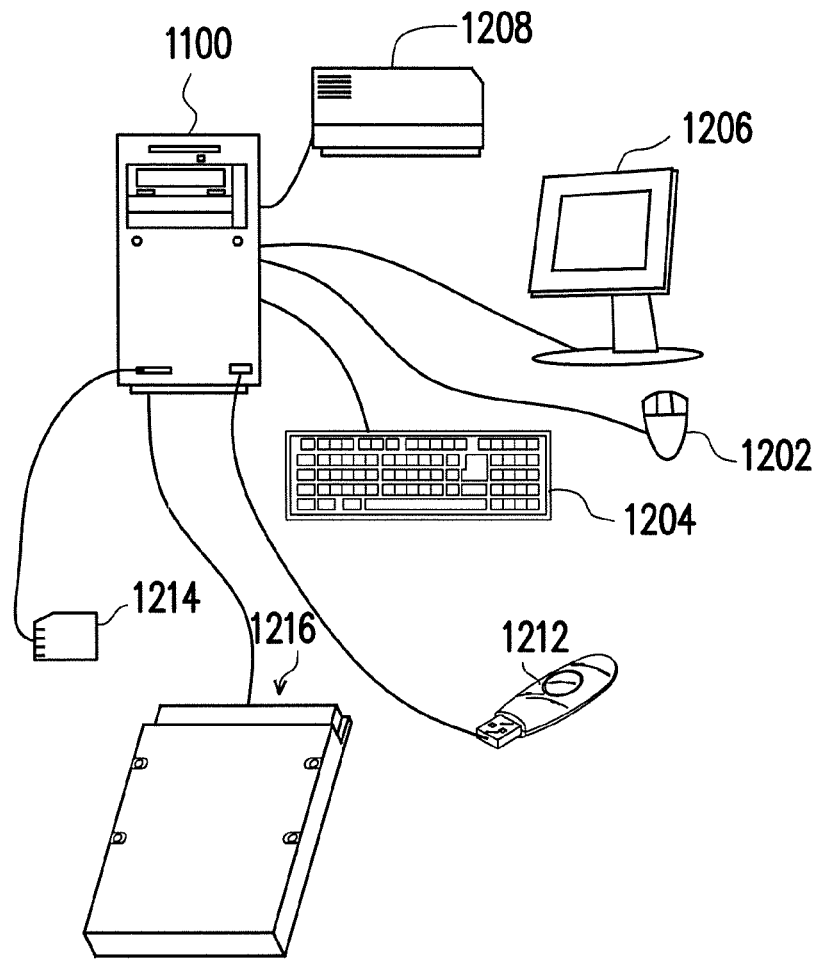
FIG. 2 is a schematic diagram illustrating a computer, an input/output device, and a memory storage apparatus according to an exemplary embodiment.

Referring to FIG. 1, a host system 1000 includes a computer 1100 and an input/output (I/O) device 1106. The computer 1100 includes a microprocessor 1102, a random access memory (RAM) 1104, a system bus 1108, and a data transmission interface 1110. For example, the I/O device 1106 includes a mouse 1202, a keyboard 1204, a display 1206 and a printer 1208 as shown in FIG. 2. It should be understood that the devices illustrated in FIG. 2 are not intended to limit the I/O device 1106, and the I/O device 1106 may further include other devices.

In the present embodiment, the memory storage apparatus 100 is coupled to other devices of the host system 1000 through the data transmission interface 1110. By using the microprocessor 1102, the random access memory (RAM) 1104 and the Input/Output (I/O) device 1106, data may be written into the memory storage apparatus 100 or may be read from the memory storage apparatus 100. For example, the memory storage apparatus 100 may be a rewritable non-volatile memory storage apparatus such as a flash drive 1210, a memory card 1212, or a solid state drive (SSD) 1214 as shown in FIG. 2.

Figure 3:
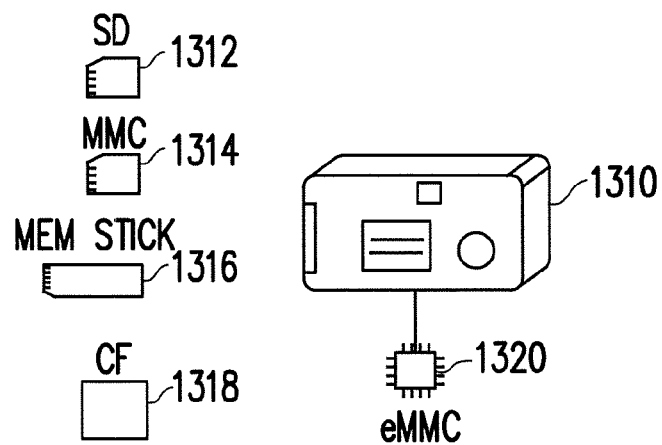
FIG. 3 is a schematic diagram illustrating a host system and a memory storage apparatus according to an exemplary embodiment.

Generally, the host system 1000 may substantially be any system capable of cooperating with the memory storage apparatus 100 for storing data. Even though the host system 1000 is illustrated as a computer system in the present exemplary embodiment, in another exemplary embodiment of the present invention, the host system 1000 may be a digital camera, a video camera, a telecommunication device, an audio player, or a video player. For example, when the host system is a digital camera (video camera) 1310, the rewritable non-volatile memory storage apparatus may be a SD card 1312, a MMC card 1314, a memory stick 1316, a CF card 1318 or an embedded storage device 1320 (as shown in FIG. 3). The embedded storage device 1320 includes an embedded MMC (eMMC). It should be mentioned that the eMMC is directly coupled to a substrate of the host system.

Figure 4:
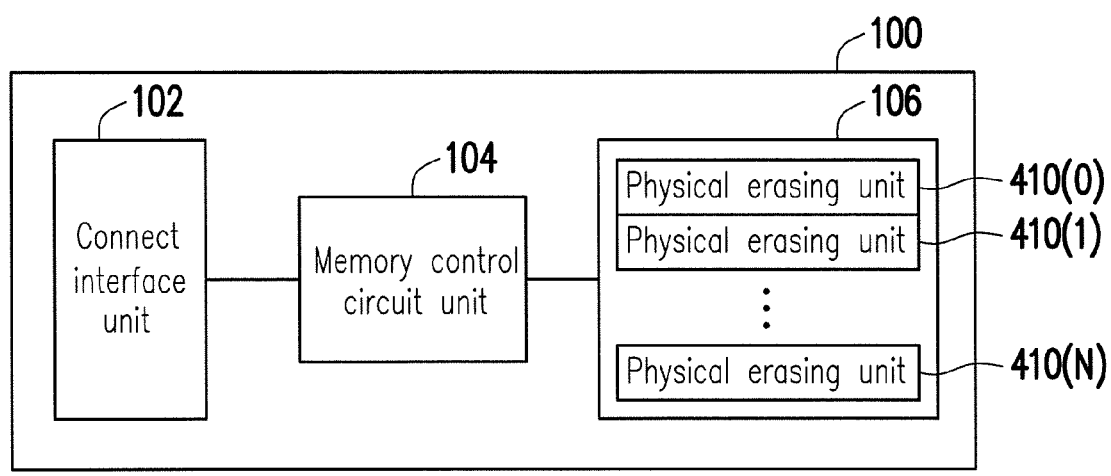
FIG. 4 is a schematic block diagram illustrating the memory storage apparatus according to an exemplary embodiment.

FIG. 4 is a schematic block diagram illustrating the memory storage apparatus according to an exemplary embodiment.

Referring to FIG. 4, the memory storage apparatus 100 includes a connection interface unit 102, a memory control circuit unit 104 and a rewritable non-volatile memory module 106.

In the present exemplary embodiment, the connection interface unit 102 is compatible with a serial advanced technology attachment (SATA) standard. However, the invention is not limited thereto, and the connection interface unit 102 may also be compatible to Parallel Advanced Technology Attachment (PATA) standard, Institute of Electrical and Electronic Engineers (IEEE) 1394 standard, Peripheral Component Interconnect (PCI) Express interface standard, Universal Serial Bus (USB) standard, Ultra High Speed-I (UHS-I) interface standard, Ultra High Speed-II (UHS-II) interface standard, Secure Digital (SD) interface standard, Memory Stick (MS) interface standard, Multi Media Card (MMC) interface standard, Compact Flash (CF) interface standard, Integrated Device Electronics (IDE) interface standard or other suitable standards. In the present exemplary embodiment, the connection interface unit and the memory control circuit unit may be packaged into one chip, or emplaced outside of a chip containing the memory control circuit unit.

The memory control circuit unit 104 is configured to execute a plurality of logic gates or control commands which are implemented in a hardware form or in a firmware form, so as to execute operations of writing, reading or erasing data in the rewritable non-volatile memory storage module 106 according to the commands of the host system 1000.

The rewritable non-volatile memory module 106 is coupled to the memory control circuit unit 104 and configured to store data written from the host system 1000. The rewritable non-volatile memory storage module 106 includes multiple physical erasing units 410(0) to 410(N). For example, the physical erasing units 410(0) to 410(N) may belong to the same memory die or belong to different memory dies. Each physical erasing unit has a plurality of physical programming units, and the physical programming units of the same physical erasing unit may be written separately and erased simultaneously. Nevertheless, it should be understood that the invention is not limited thereto. Each physical erasing unit is composed by 64 physical programming units, 256 physical programming units or any amount of the physical programming units.

More specifically, the physical erasing unit is a minimum unit for erasing. Namely, each physical erasing unit contains the least number of memory cells to be erased together. The physical programming unit is the minimum unit for programming. That is, the programming unit is the minimum unit for writing data. Each physical programming unit usually includes a data bit area and a redundancy bit area. The data bit area having multiple physical access addresses is used to store user data, and the redundant bit area is used to store system data (e.g., control information and error checking and correcting code). In the present exemplary embodiment, each data bit area of the physical programming unit contains 4 physical access addresses, and the size of each physical access address is 512 bytes. However, in other exemplary embodiments, the data bit area may also include more or less of the physical access addresses, and an amount and a size of the physical access addresses are not limited in the invention. For example, in an exemplary embodiment, the physical erasing unit is a physical block, and the physical programming unit is a physical page or a physical sector, but the invention is not limited thereto.

In the present exemplary embodiment, the rewritable non-volatile memory module 106 is a Multi Level Cell (MLC) NAND flash memory module (i.e., a flash memory module capable of storing two data bits in one memory cell). However, the disclosure is not limited thereto. The rewritable non-volatile memory module 106 may also be a Single Level Cell (SLC) NAND flash memory module, (i.e., a flash memory module capable of storing one data bit in one memory cell), a Trinary Level Cell (TLC) NAND flash memory module (i.e., a flash memory module capable of storing three data bits in one memory cell), other flash memory modules or any memory module having the same features.

Figure 5:
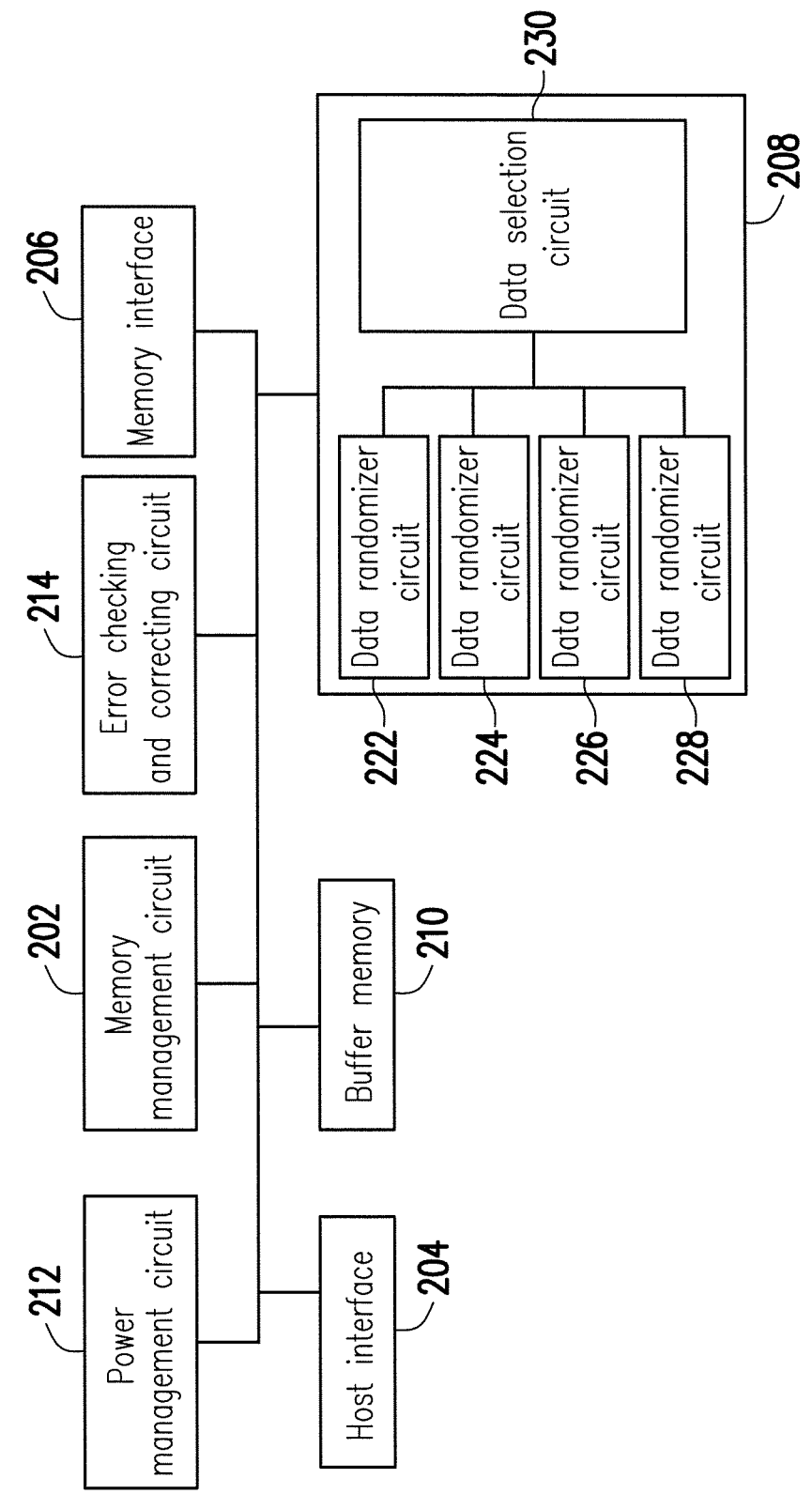
FIG. 5 is a schematic block diagram illustrating a memory control circuit unit according to an exemplary embodiment.

FIG. 5 is a schematic block diagram illustrating a memory control circuit unit according to an exemplary embodiment.

Referring to FIG. 5, the memory control circuit unit 104 includes a memory management circuit 202, a host interface 204, a memory interface 206 and a data randomizer circuit group 208.

The memory management circuit 202 is configured to control overall operations of the memory control circuit unit 104. Specifically, the memory management circuit 202 has a plurality of control commands. And, when the memory storage apparatus 100 operates, the control commands are executed to issue commands for the rewritable non-volatile memory module to execute operations of writing, reading or erasing data.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. When the memory storage apparatus 100 operates, the control commands are executed by the microprocessor to perform operations of writing, reading or erasing data.

Figure 6:
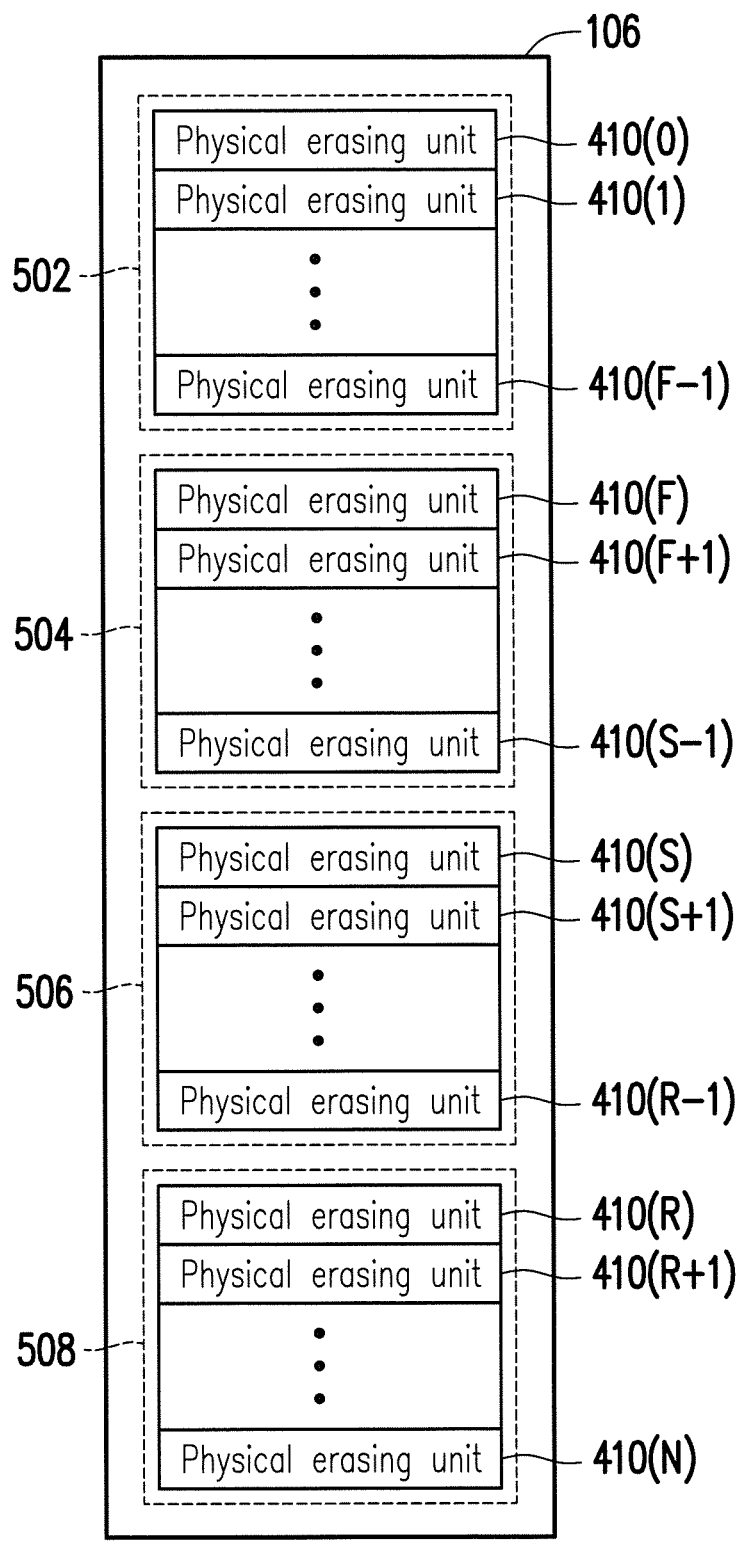
FIG. 6 and FIG. 7 are schematic diagrams illustrating a management of physical blocks according to first exemplary embodiment.
Figure 7:
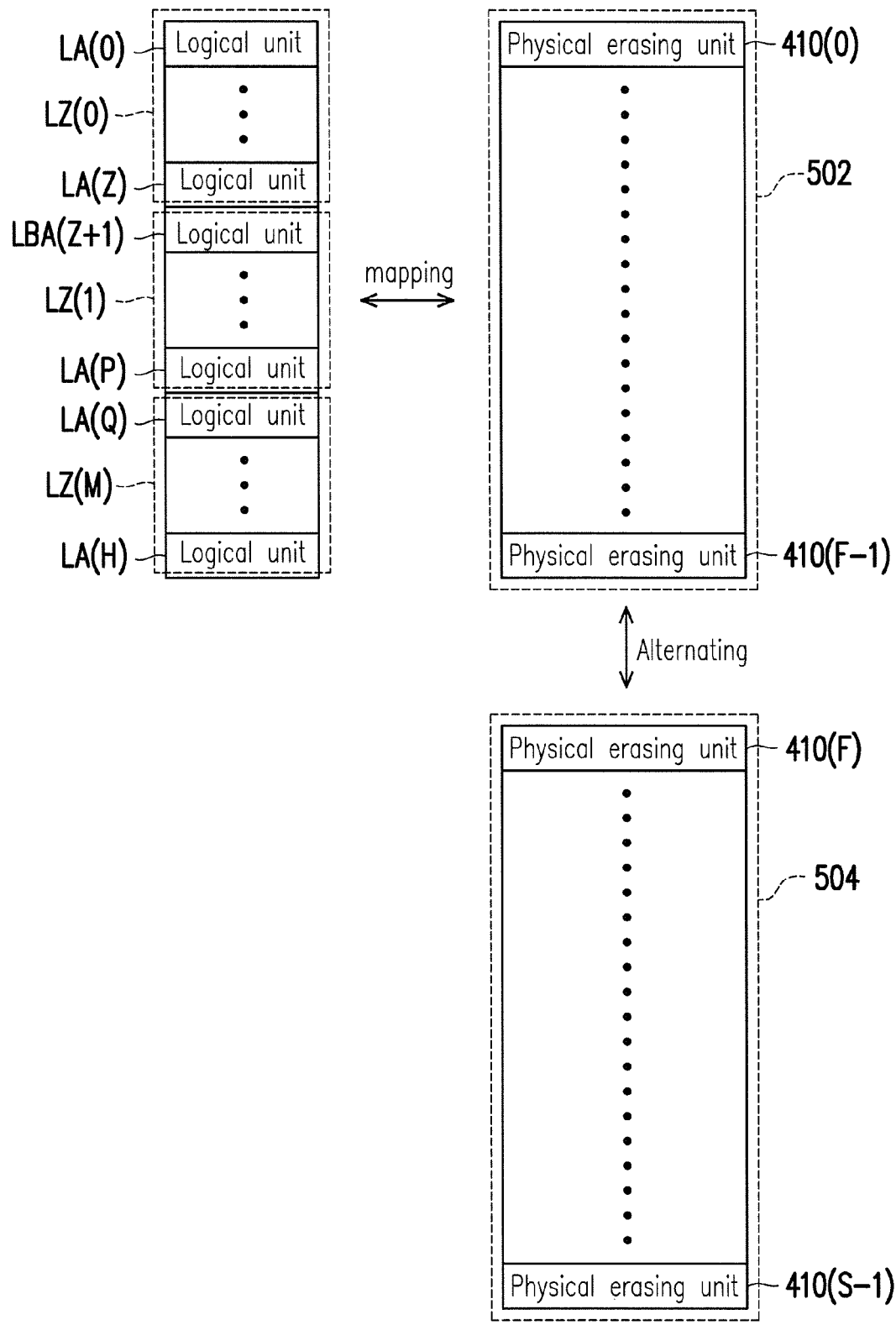

FIG. 6 and FIG. 7 are schematic diagrams illustrating a management of the physical erasing units according to an exemplary embodiment.

Referring to FIG. 6, the memory control circuit unit 104 (or the memory management circuit 202) may logically group the physical erasing units 410(0) to 410(N) into a data area 502, a spare area 504, a system area 506 and a replacement area 508.

The physical erasing units logically belonging to the data area 502 and the spare area 504 are configured to store data from the host system 1000. More specifically, the physical erasing units of the data area 502 are regarded as the physical erasing units stored with the data, whereas the physical erasing units of the spare area 504 are configured to replace the physical erasing units of the data area 502. In other words, when the write command and the data to be written are received from the host system 1000, the memory management unit 202 selects the physical erasing units from the spare area 504, and writes the data into the selected physical erasing units in order to replace the physical erasing units in the data area 502.

The physical erasing units logically belonging to the system area 506 are configured to record system data. For example, the system data includes information related to manufacturer and model of the rewritable non-volatile memory module, a number of physical erasing units in the rewritable non-volatile memory module, a number of the physical programming units in each physical erasing unit, and so forth.

The physical erasing units logically belonging to the replacement area 508 are used in a bad physical erasing unit replacement procedure for replacing damaged physical erasing units. More specifically, if available physical erasing units are still present in the replacement area 508 when the physical erasing units of the data area 502 are damaged, the memory management circuit 202 selects the available physical erasing units from the replacement area 508 for replacing the damaged physical erasing units.

Particularly, the numbers of the physical erasing units in the data area 502, the spare area 504, the system 506 and the replacement area 508 may be different from one another according to the different memory specifications. In addition, it should be understood that, during operations of the memory storage apparatus 100, grouping relations of the physical erasing units for associating with the data area 502, the spare area 504, the system area 506, and replacement area 508 may be dynamically changed. For example, when the damaged physical erasing units in the spare area 504 are replaced by the physical erasing units in the replacement area 508, the physical erasing units originally from the replacement area 508 are then associated with the spare area 504.

Referring to FIG. 7, the memory control circuit unit 104 (or the memory management circuit 202) is disposed with logical units LA(0) to LA(H) to map the physical erasing units in the data area 502. Each of the logical units has a plurality of logical sub-units to be mapped to the physical programming units of the corresponding physical erasing unit. Further, when the host system 1000 intends to write the data into the logical units or update the data stored in the logical units, the memory control circuit unit 104 (or the memory management unit 202) may retrieve one physical erasing units from the spare area 504 for writing the data as an alternately exchange of the physical erasing units of the data area 502. In this exemplary embodiment, the logical sub-units may be logical pages or logical sectors.

In order to identify which of the physical erasing units is stored with the data of each logical unit, the memory control circuit unit 104 (or the memory management circuit 202) may record the mapping relations between the logical units and the physical erasing units in the present exemplary embodiment. Further, when the host system 1000 intends to access the data in the logical sub-unit, the memory control circuit unit 104 (or the memory management circuit 202) confirms the logical unit to which the logical sub-unit belongs, and accesses the data in the physical erasing units mapped to said logical unit. For instance, in the present exemplary embodiment, the memory control circuit unit 104 (or the memory management circuit 202) may store a logical-to-physical address mapping table into the rewritable non-volatile memory module 106 for recording the physical erasing units mapped to each of the logical units, and the logical-to-physical address mapping table are loaded into the buffer memory 210 for maintenance when the memory control circuit unit 104 (or the memory management circuit 202) intends to the access the data.

It should be noted that, the mapping table cannot record the mapping relation for all of the logical units because a capacity of the buffer memory 210 is limited. Therefore, in the present exemplary embodiment, the memory control circuit unit 104 (or the memory management unit 202) groups the logical units LA(0) to LA(H) into a plurality of logical zones LZ(0) to LZ(M), and disposes one logical-to-physical address mapping table for each of the logical zones. In particular, when the memory control circuit unit 104 (or the memory management unit 202) intends to update the mapping table for one specific logical unit, the logical-to-physical address mapping table of the logical zone correspondingly belonging to the logical unit is loaded into the buffer memory 210 for updating.

As described above, in the present exemplary embodiment, the rewritable non-volatile memory module 106 of the memory storage apparatus 100 is of the page-based management. Accordingly, when the write command is executed, regardless of the logical sub units of the which logical unit are to be written with the current data, the memory control circuit unit 104 (or the memory management unit 202) writes the data in a manner of one physical programming unit after another physical programming unit (hereinafter, also known as a random writing mechanism). More specifically, the memory control circuit unit 104 (or the memory management circuit 202) may get an empty physical erasing unit from the spare area 504 to be used as a current physical erasing unit for writing data. Further, when the current physical erasing unit used is fully written, the memory control circuit unit 104 (or the memory management circuit 202) gets another empty physical erasing unit from the spare area 504 to serve as the current physical erasing unit used to continuously write the data corresponding to the write command from the host system 1000. Particularly, in order to prevent the physical erasing units of the spare area 504 from exhausting, when the memory control circuit unit 104 (or the memory management circuit 202) intends to select the physical erasing units from the spare area 504 while the number of the physical erasing units of the spare area 504 is reduced to a garbage collecting threshold, the memory control circuit unit 104 (or the memory management circuit 202) first executes a data merging procedure so the data of at least one physical erasing unit of the data area 502 becomes invalid data, and associates all the physical erasing units having the invalid data among the data stored in the data area 502 back to the spare area 504, such that the number of physical erasing units in the spare area 504 may be greater than the set garbage collecting threshold. For instance, when the data merging procedure is executed, the memory control circuit unit 104 (or the memory management circuit 202) is required to use at least one empty physical erasing unit. Therefore, the garbage collecting threshold is at least set to be a value grater than 1.

In another exemplary embodiment, the control commands of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), the read only memory (not illustrated) and a random access memory (not illustrated). Particularly, the read only memory has a boot code, which is executed by the microprocessor unit to load the control commands stored in the rewritable non-volatile memory module 106 to the random access memory of the memory management circuit 202 when the memory control circuit unit 104 is enabled. Thereafter, the control commands are executed by the microprocessor unit to execute operations of writing, reading or erasing data.

Further, in another exemplary embodiment, the control commands of the memory management circuit 202 may also be implemented in a form of hardware. For example, the memory management circuit 202 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 106; the memory writing circuit is configured to issue a write command to the rewritable non-volatile memory module 106 in order to write data into the rewritable non-volatile memory module 106; the memory reading circuit is configured to issue a read command to the rewritable non-volatile memory module 106 in order to read data from the rewritable non-volatile memory module 106; the memory erasing circuit is configured to issue an erase command to the rewritable non-volatile memory module 106 in order to erase data from the rewritable non-volatile memory module 106; the data processing circuit is configured to process both the data to be written to the rewritable non-volatile memory module 106 and the data to be read from the rewritable non-volatile memory module 106.

Referring back to FIG. 5, the host interface 204 is coupled to the memory management circuit 202 and configured to receive and identify commands and data transmitted from the host system 1000. In other words, the commands and data sent from the host system 1000 are passed to the memory management circuit 202 through the host interface 204. In the present exemplary embodiment, the host interface 204 is compatible with the SATA standard. However, it should be understood that the present invention is not limited thereto, and the host interface 204 may also be compatible with a PATA standard, an IEEE 1394 standard, a PCI Express standard, a USB standard, a UHS-I standard, a UHS-II standard, a SD standard, a MS standard, a MMC standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

The data randomizer circuit group 208 is coupled to the memory management circuit 202, and configured to disarrange (reprocess) the data to be written into the rewritable non-volatile memory module 106 and restore (rearrange) the data read from the rewritable non-volatile memory module 106. Specifically, for making the data programmed into the rewritable non-volatile memory module 106 to present an irregular random state, the data needs to go through a disarranging process (e.g., editing, calculating or rearranging) of the data randomizer circuit group 208 before it can be programmed, so that the data practically programmed into the physical programming units is properly disarranged in order to prevent the errors from occurring on the data identification due to factors such as uneven arrangement, shifts in reading voltage or uneven resistance on bit lines. Herein, a new data obtained from the disarranging process is different from the original data, and yet a proportion of "0" and "1" in the new data may be identical to or different from the original data. Similarly, because the data practically programmed into the physical programming units is already disarranged, the data read from the rewritable non-volatile memory module 106 also needs to go through a reverse process of the data randomizer circuit group 208 before it can be restored back to the original data.

In the present exemplary embodiment, the data randomizer circuit group 208 includes a data randomizer circuit 222, a data randomizer circuit 224, a data randomizer circuit 226, a data randomizer circuit 228 and a data selection circuit 230.

The data randomizer circuit 222, the data randomizer circuit 224, the data randomizer circuit 226 and the data randomizer circuit 228 are configured to disarrange the data inputted to data randomizer circuit group 208 and output a corresponding disarranged (or randomized) data. For example, in an exemplary embodiment, the data randomizer circuit 222, the data randomizer circuit 224, the data randomizer circuit 226 and the data randomizer circuit 228 respectively include different random seeds, and respectively use the random seeds to perform a logic operation on the received data in order to generate the corresponding disarranged data. For example, the logic operation may be an exclusion (XOR) operation or any algorithm. In the present exemplary embodiment, the data randomizer circuit 222, the data randomizer circuit 224, the data randomizer circuit 226 and the data randomizer circuit 228 operate in parallel. In other words, when the data is inputted into the data randomizer circuit group 208, the data randomizer circuit 222, the data randomizer circuit 224, the data randomizer circuit 226 and the data randomizer circuit 228 simultaneously generate the corresponding disarranged data. It is worth mentioning that, in another exemplary embodiment, the data randomizer circuit 222, the data randomizer circuit 224, the data randomizer circuit 226 and the data randomizer circuit 228 are also capable of outputting the disarranged data in sequence. It should be understood that, generating the disarranged data by using the exclusion operation is merely an example, and the present invention is not limited thereto.

The data selection circuit 230 is coupled to the data randomizer circuit 222, the data randomizer circuit 224, the data randomizer circuit 226 and the data randomizer circuit 228, and configured to receive and analyze the disarranged data generated by the data randomizer circuit 222, the data randomizer circuit 224, the data randomizer circuit 226 and the data randomizer circuit 228. Particularly, the data selection circuit 230 selects one with an optimal disarranging effect for the data as an outputting data randomizer circuit of the data randomizer circuit group 208 according to a content of the disarranged data generated by the data randomizer circuit 222, the data randomizer circuit 224, the data randomizer circuit 226 and the data randomizer circuit 228. It is worth mentioning that, when the data is to be rearranged, the outputting data randomizer circuit is required in order to correctly restore the original data. Accordingly, when selecting the data for a final output, the data selection circuit 230 also records an index number of the data randomizer circuit that generates such data. It is worth mentioning that, in the present exemplary embodiment, the data selection circuit 230 selects the data for the final output according to the disarranged data outputted by the data randomizer circuit 222, the data randomizer circuit 224, the data randomizer circuit 226 and the data randomizer circuit 228. However, the present invention is not limited thereto. In another exemplary embodiment, the data selection circuit 230 may also select a corresponding data randomizer circuit according to the inputted data to generate the disarranged data as the data for the final output.

For example, in an exemplary embodiment, the data selection circuit 230 calculates an evenly-arranged degree of different values in data bits of the disarranged data generated by the data randomizer circuit 222, the data randomizer circuit 224, the data randomizer circuit 226 and the data randomizer circuit 228, and selects one data among the disarranged data as the data for final output according to the evenly-arranged degree. Herein, the evenly-arranged degree of the selected data is higher than the evenly-arranged degree of non-selected data.

For example, each of the data bits of the disarranged data generated by the data randomizer circuit 222, the data randomizer circuit 224, the data randomizer circuit 226 and the data randomizer circuit 228 may be identified as a first value or a second value, and a difference between an amount of the data bits belonging to the first value and an amount of the data bits belong to the second value is regarded as a corresponding disarranging value of that data. Particularly, the data selection circuit 230 selects the data with the smallest disarranging value as the data for the final output. Herein, the data bit is "1" or "0." In the present exemplary embodiment, "1" is referred to as the first value and "0" is referred to as the second value, but the present invention is not limited thereto. In another exemplary embodiment, "1" may also be referred to as the second value and "0" may also be referred to as the first value.

Figure 8:
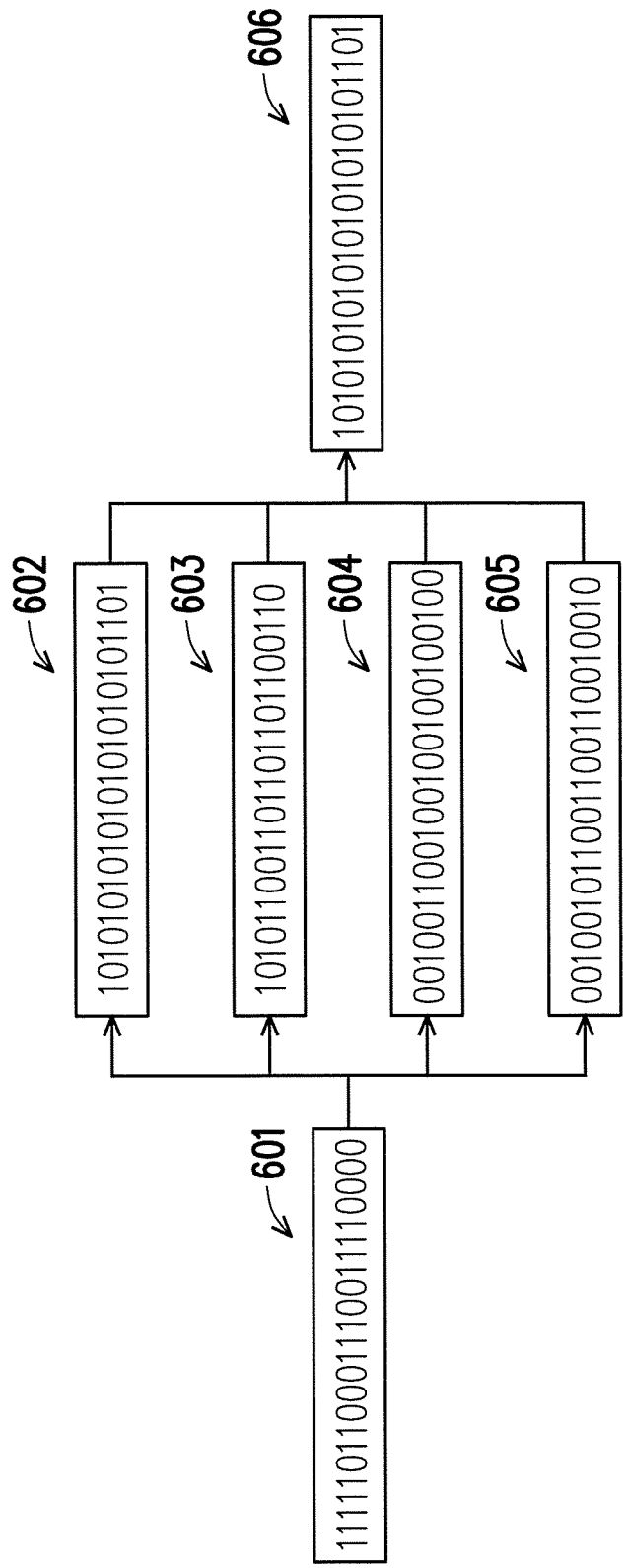
FIG. 8 is an example illustrating the disarranged data and the selected data according to an exemplary embodiment.

FIG. 8 is an example illustrating the disarranged data and the selected data according to an exemplary embodiment.

Referring to FIG. 8, when a data (hereinafter, referred to as a first data stream 601) with the content of "1111101100011100011110000" is inputted into the data randomizer circuit group 208, the data randomizer circuit 222, the data randomizer circuit 224, the data randomizer circuit 226 and the data randomizer circuit 228 respectively disarrange the first data according to the random seeds and generate corresponding disarranged data (hereinafter, referred to as second data streams). In this case, the data randomizer circuit 222 outputs data with the content of "1010101010101010101101," the data randomizer circuit 224 outputs data with the content of "1010110011011011011100110," the data randomizer circuit 226 outputs data with the content of "0010011001001001001001100," and the data randomizer circuit 228 outputs data with the content of "0010010110011001100110010010."

For a data stream 602 with the content of "1010101010101010101101" outputted by the data randomizer circuit 222, the data selection circuits 230 calculates the amount of the data bits being the first value (i.e., 13) and the amount of the data bits being the second value (i.e., 11), and calculates the difference between the amount of the data bits being the first value and the amount of the data bits being the second value (i.e., 2) to be used as the disarranging value of the data stream 602.

For a data stream 603 with the content of "10101100110110110110011" outputted by the data randomizer circuit 224, the data selection circuits 230 calculates the amount of the data bits being the first value (i.e., 14) and the amount of the data bits being the second value (i.e., 10), and calculates the difference between the amount of the data bits being the first value and the amount of the data bits being the second value (i.e., 4) to be used as the disarranging value of the data stream 603.

For a data stream 604 with the content of "001001100100100100100100" outputted by the data randomizer circuit 226, the data selection circuits 230 calculates the amount of the data bits being the first value (i.e., 8) and the amount of the data bits being the second value (i.e., 16), and calculates the difference between the amount of the data bits being the first value and the amount of the data bits being the second value (i.e., 8) to be used as the disarranging value of the data stream 604.

For a data stream 605 with the content of "001001011001100110010010" outputted by the data randomizer circuit 228, the data selection circuits 230 calculates the amount of the data bits being the first value (i.e., 10) and the amount of the data bits being the second value (i.e., 14), and calculates the difference between the amount of the data bits being the first value and the amount of the data bits being the second value (i.e., 4) to be used as the disarranging value of the data stream 605.

Thereafter, the data selection circuit 230 compares the disarranging value of the data stream 602, the disarranging value of the data stream 603, the disarranging value of the data stream 604 and the disarranging value of the data stream 605, and selects the data stream 602 with the smallest disarranging value as a data stream 606 for the final output (hereinafter, referred to as third data).

It should be understood that, aforesaid method of selecting the third data for the final output from the second data outputted by the data randomizer circuits is merely an example, and the present invention is not limited thereto. For example, in another exemplary embodiment, the data selection circuit 230 may also group consecutive identical data bits divided according to the value of each of the data bits in the second data outputted by the data selection circuits into one string, and select the data for the final output according to an amount of the strings with the shortest length (also known as a first count). For example, for the data stream 602 with the content of "1010101010101010101101" outputted by the data randomizer circuit 222, the data selection circuit 230 sequentially divides the data stream 602 into the strings of "1," "0," "1," "0," "1," "0," "1," "0," "1," "0," "1," "0," "1," "0," "1," "0," "1," "0," "1," "0", "11," "0" and "1," and calculates the amount of the strings with the data length of one bit (i.e., 22). For the data stream 603 with the content of "10101100110110110110011" outputted by the data randomizer circuit 224, the data selection circuit 230 sequentially divides the data stream 603 into the strings of "1," "0," "1," "0," "11," "00," "11," "0," "11," "0," "11," "00," "11" and "0," and calculates the amount of the strings with the data length of one bit (i.e., 8). For the data stream 604 with the content of "001001100100100100100100" outputted by the data randomizer circuit 226, the data selection circuit 230 sequentially divides the data stream 604 into the strings of "00," "1," "00," "11," "00," "1," "00," "1," "00," "1," "00," "1," "00," "1" and "00," and calculates the amount of the strings with the data length of one bit (i.e., 6). Further, for the data stream 605 with the content of "001001011001100110010010" outputted by the data randomizer circuit 228, the data selection circuit 230 sequentially divides the data stream 605 into the strings of "00," "1," "00," "1," "0," "11," "00," "11," "00," "11," "00," "1," "00," "1" and "0," and calculates the amount of the strings with the data length of one bit (i.e., 6). Lastly, the data selection circuit 230 selects the data stream 602 having the most of strings with the data length of one bit as the data stream 606 for the final output. In another exemplary embodiment, after the data is divided in aforesaid fashion, the data selection circuit 230 may also calculate a sum of an amount of the strings with the data length of one bit (also known as the first count) and an amount of the strings with the data length of two bit (also known as a second count) to serve as a reference for selecting the data for the final output. For example, in the embodiment of FIG. 6, the data stream 602 is divided into 23 strings (i.e., "1," "0," "1," "0," "1," "0," "1," "0," "1," "0," "1," "0," "1," "0," "1," "0," "1," "0," "1," "0," "11," "0" and "1"), the data stream 603 is divided into 16 strings (i.e., "1," "0," "1," "0," "11," "00," "11," "0," "11," "0," "11," "0," "11," "00," "11" and "0"), the data stream 604 is divided into 15 strings (i.e., "00," "1," "00," "11," "00," "1," "00," "1," "00," "1," "00," "1," "00," "1" and "00"), the data stream 605 is divided into 15 strings (i.e., "00," "1," "00," "1," "0," "11," "00," "11," "00," "11," "00," "1", "00," "1" and "0"). Accordingly, the data selection circuit 230 selects the data stream 602 having the most of the strings with the data length of one bit and the data length of two bit as the data stream 606 for the final output.

It should be understood that, although the data randomizer circuit group 208 is implemented to include four data randomizer circuits, but the present invention is not limited thereto. The number of the data randomizer circuit may be two, three or even more.

It is worth mentioning that, it is possible that the original data to be written by the host system 1000 is already disarranged properly without needing further disarrangement. Therefore, in another exemplary embodiment, it is also possible that one of the data randomizer circuits may be turned off to directly output the original data transmitted by the host system 1000. For example, in the data randomizer circuit group 208, the data randomizer circuits 222, 224 and 226 (hereinafter, referred to as first data randomizer circuits) are normally turned on for operation, yet the data randomizer circuit 228 (hereinafter, referred to as a second data randomizer circuit) is turned off. Accordingly, the second data stream outputted by the first data randomizer circuits and the second data stream outputted by the second data randomizer circuit (i.e., the original data which is not disarranged) may be transmitted together to the data selection circuit 230 for analysis and selection. As such, the original that is already disarranged properly may be used as the data for the final output.

Referring to FIG. 5, in an exemplary embodiment, the memory control circuit unit 104 further includes a buffer memory 210, a power management circuit 212 and an error checking and correcting circuit 214.

The buffer memory 210 is coupled to the memory management circuit 202 and configured to temporarily store data and commands from the host system 1000 or data from the rewritable non-volatile memory module 106.

The power management unit 212 is coupled to the memory management circuit 202 and configured to control a power of the memory storage apparatus 100.

The error checking and correcting circuit 214 is coupled to the memory management circuit 202 and configured to execute an error checking and correcting process to ensure the correctness of data. Specifically, when the memory management circuit 202 receives a write command from the host system 1000, the error checking and correcting circuit 214 generates an error checking and correcting code (ECC code) for data corresponding to the write command, and the memory management circuit 202 writes data and the ECC code corresponding to the write command to the rewritable non-volatile memory module 106. Subsequently, when the memory management circuit 202 reads the data from the rewritable non-volatile memory module 106, the error checking and correcting code corresponding to the data is also read, and the error checking and correcting circuit 214 may execute the error checking and correcting procedure for the read data according to the error checking and correcting code.

Figure 9:
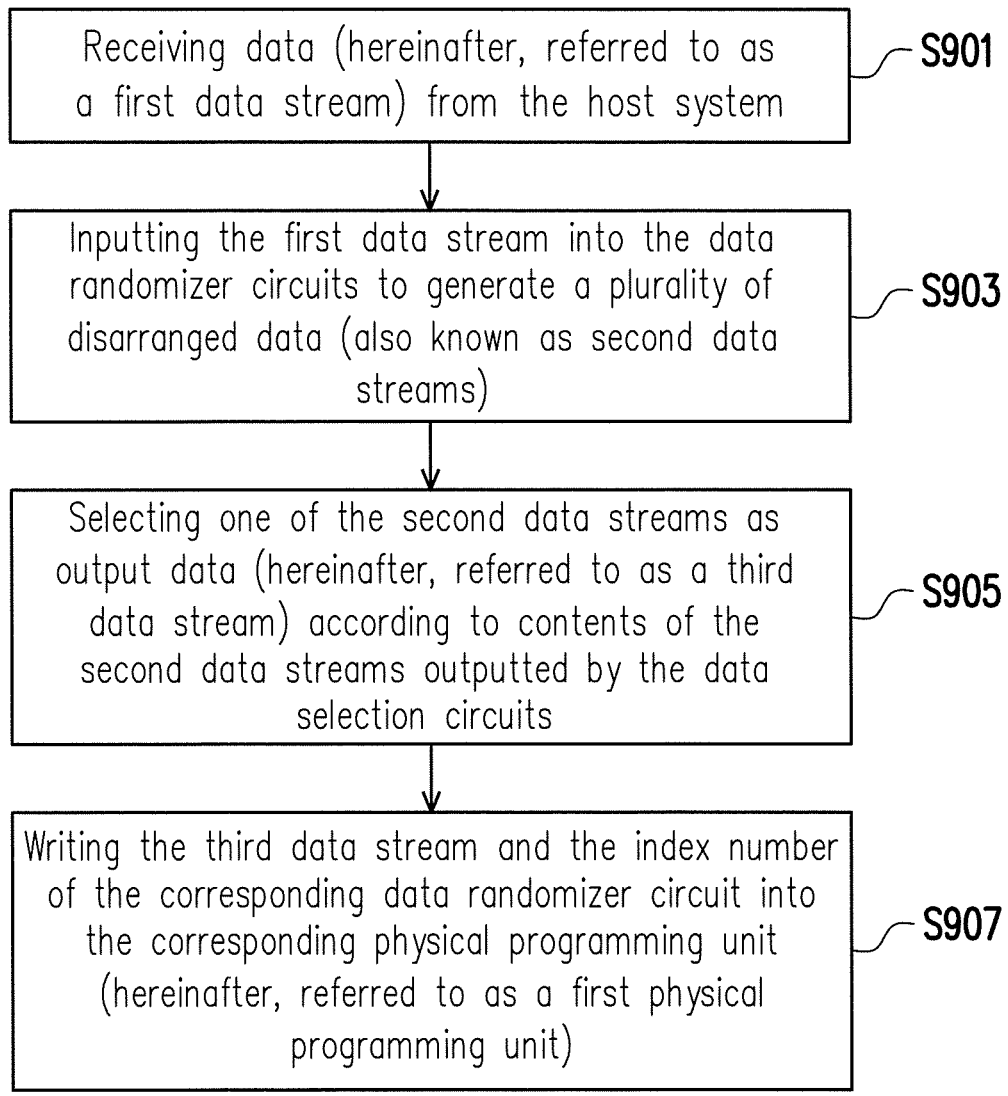
FIG. 9 illustrates a flowchart for writing data according to an exemplary embodiment.

FIG. 9 illustrates a flowchart for writing data according to an exemplary embodiment.

Referring to FIG. 9, in step S901, the memory control circuit unit 104 (or the memory management circuit 202) receives data (hereinafter, referred to as a first data stream) from the host system 1000.

In step S903, the memory control circuit unit 104 (or the memory management circuit 202) inputs the first data stream into the data randomizer circuits 222, 224, 226 and 228 to generate a plurality of disarranged data (also known as second data streams).

In step S905, the memory control circuit unit 104 (or the data selection circuit 230) selects one of the second data streams as output data (hereinafter, referred to as a third data stream) according to contents of the second data streams outputted by the data randomizer circuits 222, 224, 226 and 228. The mechanism of selecting the second data stream with the highest disarranged degree outputted from the data randomizer circuits 222, 224, 226 and 228 has been described in detail as above with reference to the drawings, and thus the related description is not repeated hereinafter.

In step S907, the memory control circuit unit 104 (or the memory management circuit 202) writes the third data stream and the index number of the corresponding data randomizer circuit (i.e., the data randomizer circuit that disarranged the selected second data stream) into the corresponding physical programming unit (hereinafter, referred to as a first physical programming unit). For example, the index number of the corresponding data randomizer circuit is stored into the redundancy bit area of that physical programming unit. In other words, in the present exemplary embodiment, among the second data streams outputted by the data randomizer circuits (e.g., the data randomizer circuit 222, the data randomizer circuit 224, the data randomizer circuit 226 and the data randomizer circuit 228), only the one second data served as the third data is written into the rewritable non-volatile memory module 106, whereas the other second data are not written into the rewritable non-volatile memory module 106.

Figure 10:
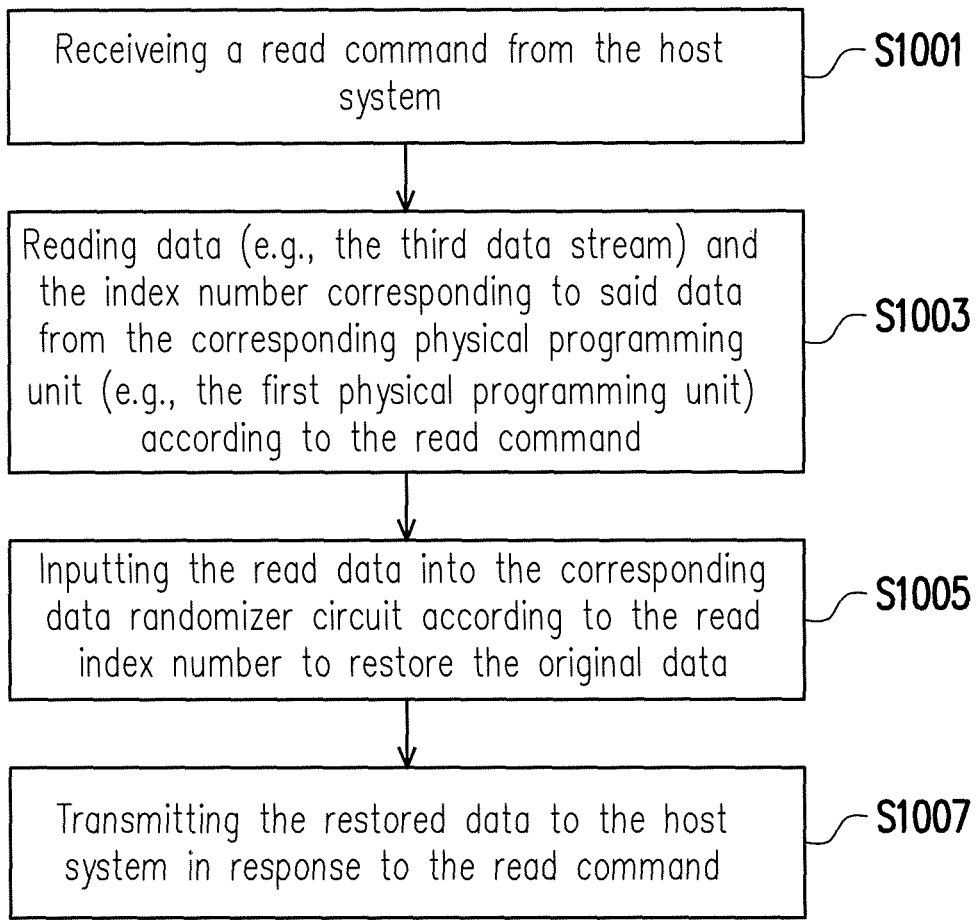
FIG. 10 illustrates a flowchart for reading data according to an exemplary embodiment.

FIG. 10 illustrates a flowchart for reading data according to an exemplary embodiment.

Referring to FIG. 10, in step S1001, the memory control circuit unit 104 (or the memory management circuit 202) receives a read command from the host system 1000.

In step S1003, the memory control circuit unit 104 (or the memory management circuit 202) reads data (e.g., the third data) and the index number corresponding to said data from the corresponding physical programming unit (e.g., the first physical programming unit) according to the read command.

In step S1005, the memory control circuit unit 104 (or the memory management circuit 202) inputs the read data into the corresponding data randomizer circuit according to the read index number to restore the original data (e.g., the first data stream).

In step S1007, the memory control circuit unit 104 (or the memory management circuit 202) transmits the restored data to the host system 1000 in response to the read command.

In summary, in the memory control circuit unit, the memory storage apparatus, and the data accessing method as proposed in the exemplary embodiments of the invention, multiple disarranged data are generated by using multiple data randomizer circuits, and the optimal data is selected as the data to be programmed into the rewritable non-volatile memory module according to the disarranged degree of the disarranged data. Accordingly, the data may be effectively disarranged to prevent errors from occurring on the data identification due to factors, such as uneven arrangement, shifts in reading voltage or uneven resistance on bit lines.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A memory control circuit unit, comprising:
a host interface configured to couple to a host system;
a memory interface configured to couple to a rewritable non-volatile memory module, wherein the rewritable non-volatile memory module has a plurality of physical programming units;
a plurality of data randomizer circuits, wherein each of the data randomizer circuits is configured to disarrange input data to output a corresponding disarranged data and each of the data randomizer circuits has an index number;
a data selection circuit; and
a memory management circuit coupled to the host interface, the memory interface, the data randomizer circuits and the data selection circuit, wherein the memory management circuit is configured to receive a first data stream from the host system, and input the first data stream into the data randomizer circuits, wherein the data randomizer circuits are configured to disarrange the first data to respectively output a plurality of second data, wherein the data selection circuit is configured to select one of the second data streams as a third data stream according to contents of the second data streams, wherein the memory management circuit is further configured to issue a command for the rewritable non-volatile memory module to write the third data stream into a first physical programming unit among the physical programming units, wherein each of the second data streams comprises a plurality of data bits, and each of the data bits is a first value or a second value, wherein in the operation of selecting the one of the second data streams as the third data stream according to the contents of the second data streams, the data selection circuit sequentially groups consecutive identical data bits in the second data streams into one string, wherein each of the second data stream is divided into a plurality of the strings and each of the data bits in the corresponding string is identical, wherein the data selection circuit calculates a corresponding first count of each of the second data streams, wherein the corresponding first counts are respectively amounts of a plurality of first strings among the strings of the second data streams, and a length of each of the first strings is 1 and each of the data bits of the first strings is the first value, wherein the corresponding first count of the one of the second data streams is not less than the corresponding first count of each of the other second data streams among the second data streams.

2. The memory control circuit unit of claim 1, wherein the memory management circuit is further configured to write the index number of one of the data randomizer circuits into the first physical programming unit, wherein the one of the data randomizer circuit outputs the one of the second data streams.

3. The memory control circuit unit of claim 2, wherein the memory management circuit receives a read command from the host system, wherein the memory management circuit reads the third data stream and the index number of the one of the data randomizer circuits from the first physical programming unit, inputs the third data stream into the one of the data randomizer circuits according to the read index number of the one of the data randomizer circuits to restore the first data stream, and transmits the restored first data stream to the host system in response to the read command.

4. The memory control circuit unit of claim 1, wherein each of the data randomizer circuits has a random seed, and the data randomizer circuits respectively use the random seeds to perform a logic operation on the first data stream to generate the second data streams.

5. The memory control circuit unit of claim 4, wherein the logic operation is an exclusion operation.

6. The memory control circuit unit of claim 1, wherein the data randomizer circuits are composed of a plurality of first data randomizer circuits and a second data randomizer circuit, wherein each of the first data randomizer circuits has a random seed, and the first data randomizer circuits respectively use the random seeds to execute an exclusion operation on the first data stream to generate a part of the second data streams, wherein the second data randomizer circuit directly uses the first data stream as another part of the second data streams.

7. The memory control circuit unit of claim 1, wherein each of the second data streams comprises a plurality of data bits, and each of the data bits is a first value or a second value, wherein the data selection circuit selects the one of the second data streams as the third data stream according to an evenly-arranged degree of the first value and the second value in the data bits of the second data, wherein the evenly-arranged degree of the first value and the second value in the data bits of the one of the second data streams is higher than the evenly-arranged degree of the first value and the second value in the data bits of other second data streams among the second data streams.

8. The memory control circuit unit of claim 1, wherein each of the second data streams comprises a plurality of data bits, and each of the data bits is a first value or a second value, wherein in the operation of selecting the one of the second data streams as the third data stream according to the contents of the second data streams, the data selection circuit calculates an amount of the data bits being the first value and an amount of the data bits being the second value in each of the second data streams and uses a difference between the amount of the data bits being the first value and the amount of the data bits being the second value in each of the second data streams as a disarranging value corresponding to each of the second data streams, wherein the disarranging value of the one of the second data streams is not greater than the disarranging values of the other second data streams among the second data streams.

9. A memory storage apparatus, comprising:

a connection interface unit configured to couple to a host system;

a rewritable non-volatile memory module, wherein the rewritable non-volatile memory module has a plurality of physical programming units; and a memory control circuit unit coupled to the connection interface unit and the rewritable non-volatile memory module, wherein the memory control circuit unit comprises a plurality of data randomizer circuits, a data selection circuit and a memory management circuit, wherein each of the data randomizer circuits disarranges input data to output a corresponding disarranged data, each of the data randomizer circuits has an index number, and the memory management circuit is coupled to the data randomizer circuits and the data selection circuit, wherein the memory management circuit is configured to receive first data stream from the host system, and input the first data stream into the data randomizer circuits, wherein the data randomizer circuits are configured to disarrange the first data stream to respectively output a plurality of second data streams, wherein the data selection circuit is configured to select one of the second data streams as a third data stream according to contents of the second data streams, wherein the memory management circuit is further configured to issue a command for the rewritable non-volatile memory module to write the third data stream into a first physical programming unit among the physical programming units, wherein each of the second data comprises a plurality of data bits, and each of the data bits is a first value or a second value, wherein in the operation of selecting the one of the second data streams as the third data stream according to the contents of the second data streams, the data selection circuit sequentially groups consecutive identical data bits in the second data streams into one string, wherein each of the second data streams is divided into a plurality of the strings and each of the data bits in the corresponding string is identical, wherein the data selection circuit calculates a corresponding first count of each of the second data streams, wherein the corresponding first counts are respectively amounts of a plurality of first strings among the strings of the second data streams, and a length of each of the first strings is 1 and each of the data bits of the first strings is the first value, wherein the corresponding first count of the one of the second data streams is not less than the corresponding first count of each of the other second data streams among the second data streams.

10. The memory storage apparatus of claim 9, wherein the memory management circuit is further configured to write the index number of one of the data randomizer circuits into the first physical programming unit, wherein the one of the data randomizer circuits outputs the one of the second data streams.

11. The memory storage apparatus of claim 10, wherein the memory management circuit receives a read command from the host system, wherein the third data stream and the index number of the one of the data randomizer circuit are read from the first physical programming unit, the third data stream is inputted into the one of the data randomizer circuit according to the read index number of the one of the data randomizer circuit to restore the first data stream, and the restored first data stream is transmitted to the host system in response to the read command.

12. The memory storage apparatus of claim 9, wherein each of the data randomizer circuits has a random seed, and the data randomizer circuits respectively use the random seeds to perform a logic operation on the first data stream to generate the second data streams.

13. The memory storage apparatus of claim 12, wherein the logic operation is an exclusion operation.

14. The memory storage apparatus of claim 9, wherein the data randomizer circuits are composed of a plurality of first data randomizer circuits and a second data randomizer circuit, wherein each of the first data randomizer circuits has a random seed, and the first data randomizer circuits respectively use the random seeds to execute an exclusion operation on the first data stream to generate a part of the second data streams, wherein the second data randomizer circuit directly uses the first data stream as another part of the second data streams.

15. The memory storage apparatus of claim 9, wherein each of the second data streams comprises a plurality of data bits, and each of the data bits is a first value or a second value, wherein the data selection circuit selects the one of the second data streams as the third data stream according to an evenly-arranged degree of the first value and the second value in the data bits of the second data streams, wherein the evenly-arranged degree of the first value and the second value in the data bits of the one of the second data streams is higher than the evenly-arranged degree of the first value and the second value in the data bits of other second data streams among the second data streams.

16. The memory storage apparatus of claim 9, wherein each of the second data comprises a plurality of data bits, and each of the data bits is a first value or a second value, wherein in the operation of selecting the one of the second data streams as the third data stream according to the contents of the second data streams, the data selection circuit calculates an amount of the data bits being the first value and an amount of the data bits being the second value in each of the second data streams and uses a difference between the amount of the data bits being the first value and the amount of the data bits being the second value in each of the second data streams as a disarranging value corresponding to each of the second data streams, wherein the disarranging value of the one of the second data streams is not greater than the disarranging values of the other second data streams among the second data streams.

17. A data accessing method for a rewritable non-volatile memory module having a plurality of physical programming units, comprising:

receiving a first data stream from the host system;

inputting the first data stream into a plurality of data randomizer circuits to generate a plurality of second data streams, wherein each of the data randomizer circuits disarranges input data to output a corresponding disarranged data and each of the data randomizer circuits has an index number;

selecting one of the second data streams as a third data stream according to contents of the second data streams; and writing the third data stream into a first physical programming unit among the physical programming units, wherein each of the second data streams comprises a plurality of data bits, and each of the data bits is a first value or a second value, wherein the step of selecting the one of the second data streams as the third data stream according to the contents of the second data streams comprises:

sequentially grouping consecutive identical data bits in the second data streams into one string, wherein each of the second data streams is divided into a plurality of the strings and each of the data bits in the corresponding string is identical;

calculating a corresponding first count of each of the second data streams, wherein the corresponding first counts are respectively amounts of a plurality of first strings among the strings of the second data streams, and a length of each of the first strings is 1 and each of the data bits of the first strings is the first value; and selecting the one of the second data streams as the third data stream, wherein the corresponding first count of the one of the second data streams is not less than the corresponding first count of each of the other second data streams among the second data streams.

18. The data accessing method of claim 17, further comprising:

writing the index number of one of the data randomizer circuits into the first physical programming unit, wherein the one of the data randomizer circuits outputs the one of the second data streams.

19. The data accessing method of claim 18, further comprising:

receiving a read command from the host system;

reading the third data stream and the index number of the one of the data randomizer circuits from the first physical programming unit;

inputting the third data stream into the one of the data randomizer circuits according to the read index number of the one of the data randomizer circuits to restore the first data stream; and transmitting the restored first data stream to the host system in response to the read command.

20. The data accessing method of claim 17, wherein each of the data randomizer circuits has a random seed, and the data randomizer circuits respectively use the random seeds to perform a logic operation on the first data stream to generate the second data streams.

21. The data accessing method of claim 20, wherein the logic operation is an exclusion operation.

22. The data accessing method of claim 17, wherein the data randomizer circuits are composed of a plurality of first data randomizer circuits and a second data randomizer circuit, wherein each of the first data randomizer circuits has a random seed, and the first data randomizer circuits respectively use the random seeds to execute an exclusion operation on the first data to generate a part of the second data streams, wherein the second data randomizer circuit directly uses the first data stream as another part of the second data streams.

23. The data accessing method of claim 17, wherein each of the second data streams comprises a plurality of data bits, and each of the data bits is a first value or a second value, wherein the step of selecting the one of the second data streams as the third data stream according to the contents of the second data streams comprises:

selecting the one of the second data streams as the third data stream according to an evenly-arranged degree of the first value and the second value in the data bits of the second data, wherein the evenly-arranged degree of the first value and the second value in the data bits of the one of the second data stream is higher than the evenly-arranged degree of the first value and the second value in the data bits of other second data streams among the second data streams.

24. The data accessing method of claim 17, wherein each of the second data streams comprises a plurality of data bits, and each of the data bits is a first value or a second value, wherein the step of selecting the one of the second data streams as the third data stream according to the contents of the second data streams comprises:

calculating an amount of the data bits being the first value and an amount of the data bits being the second value in each of the second data streams and using a difference between the amount of the data bits being the first value and the amount of the data bits being the second value in each of the second data streams as a disarranging value corresponding to each of the second data streams; and selecting the one of the second data streams as the third data stream, wherein the disarranging value of the one of the second data streams is not greater than the disarranging values of the other second data streams among the second data.

25. A memory control circuit unit, comprising:

a host interface configured to couple to a host system;

a memory interface configured to couple to a rewritable non-volatile memory module, wherein the rewritable non-volatile memory module has a plurality of physical programming units;

a plurality of data randomizer circuits, wherein each of the data randomizer circuits is configured to disarrange input data to output a corresponding disarranged data and each of the data randomizer circuits has an index number;

a data selection circuit; and a memory management circuit coupled to the host interface, the memory interface, the data randomizer circuits and the data selection circuit, wherein the memory management circuit is configured to receive a first data stream from the host system, and input the first data stream into the data randomizer circuits, wherein the data randomizer circuits are configured to disarrange the first data to respectively output a plurality of second data, wherein the data selection circuit is configured to select one of the second data streams as a third data stream according to contents of the second data streams, wherein the memory management circuit is further configured to issue a command for the rewritable non-volatile memory module to write the third data stream into a first physical programming unit among the physical programming units, wherein each of the second data streams comprises a plurality of data bits, and each of the data bits is a first value or a second value, wherein in the operation of selecting the one of the second data streams as the third data stream according to the contents of the second data streams, the data selection circuit sequentially groups consecutive identical data bits in the second data streams into one string, wherein each of the second data streams is divided into a plurality of the strings and each of the data bits in the corresponding string is identical, wherein the data selection circuit calculates a corresponding first count and a corresponding second count of each of the second data streams, wherein the corresponding first counts are respectively amounts of a plurality of first strings among the strings of the second data, and a length of each of the first strings is 1 and each of the data bits of the first strings is the first value, wherein the corresponding second counts are respectively amounts of a plurality of second strings among the strings of the second data streams, and a length of each of the second strings is 2 and each of the data bits of the second strings is the first value, wherein a sum of the corresponding first count and the corresponding second count of the one of the second data streams is not less than the sum of the corresponding first count and the corresponding second count of each of the other second data streams among the second data streams.

26. A memory storage apparatus, comprising:

a connection interface unit configured to couple to a host system;

a rewritable non-volatile memory module, wherein the rewritable non-volatile memory module has a plurality of physical programming units; and a memory control circuit unit coupled to the connection interface unit and the rewritable non-volatile memory module, wherein the memory control circuit unit comprises a plurality of data randomizer circuits, a data selection circuit and a memory management circuit, wherein each of the data randomizer circuits disarranges input data to output a corresponding disarranged data, each of the data randomizer circuits has an index number, and the memory management circuit is coupled to the data randomizer circuits and the data selection circuit, wherein the memory management circuit is configured to receive first data stream from the host system, and input the first data stream into the data randomizer circuits, wherein the data randomizer circuits are configured to disarrange the first data stream to respectively output a plurality of second data streams, wherein the data selection circuit is configured to select one of the second data streams as a third data stream according to contents of the second data streams, wherein the memory management circuit is further configured to issue a command for the rewritable non-volatile memory module to write the third data stream into a first physical programming unit among the physical programming units, wherein each of the second data streams comprises a plurality of data bits, and each of the data bits is a first value or a second value, wherein in the operation of selecting the one of the second data streams as the third data stream according to the contents of the second data streams, the data selection circuit sequentially groups consecutive identical data bits in the second data streams into one string, wherein each of the second data streams is divided into a plurality of the strings and each of the data bits in the corresponding string is identical, wherein the data selection circuit calculates a corresponding first count and a corresponding second count of each of the second data streams, wherein the corresponding first counts are respectively amounts of a plurality of first strings among the strings of the second data streams, and a length of each of the first strings is 1 and each of the data bits of the first strings is the first value, wherein the corresponding second counts are respectively amounts of a plurality of second strings among the strings of the second data streams, and a length of each of the second strings is 2 and each of the data bits of the second strings is the first value, wherein a sum of the corresponding first count and the corresponding second count of the one of the second data streams is not less than the sum of the corresponding first count and the corresponding second count of each of the other second data streams among the second data.

27. A data accessing method for a rewritable non-volatile memory module having a plurality of physical programming units, comprising:

receiving a first data stream from the host system;

inputting the first data stream into a plurality of data randomizer circuits to generate a plurality of second data streams, wherein each of the data randomizer circuits disarranges input data to output a corresponding disarranged data and each of the data randomizer circuits has an index number;

selecting one of the second data streams as a third data stream according to contents of the second data streams; and writing the third data stream into a first physical programming unit among the physical programming units, wherein each of the second data streams comprises a plurality of data bits, and each of the data bits is a first value or a second value, wherein the step of selecting the one of the second data streams as the third data stream according to the contents of the second data streams comprises:

sequentially grouping consecutive identical data bits in the second data streams into one string, wherein each of the second data streams is divided into a plurality of the strings and each of the data bits in the corresponding string is identical;

calculating a corresponding first count and a corresponding second count of each of the second data stream, wherein the corresponding first counts are respectively amounts of a plurality of first strings among the strings of the second data streams and the corresponding second counts are respectively amounts of a plurality of second strings among the strings of the second data streams, a length of each of the first strings is 1 and each of the data bits of the first strings is the first value, and a length of each of the second strings is 2 and each of the data bits of the second strings is the first value; and selecting the one of the second data streams as the third data stream, wherein a sum of the corresponding first count and the corresponding second count of the one of the second data streams is not less than the sum of the corresponding first count and the corresponding second count of each of the other second data streams among the second data streams.

* * * * *